United States Patent
Carson

[11] 3,940,748
[45] Feb. 24, 1976

[54] OPTICAL INFORMATION PROCESSING SYSTEM WITH COLOR CENTER CRYSTAL

[76] Inventor: Arthur N. Carson, 14 Daniel Road, Bristol, Conn. 06010

[22] Filed: Nov. 14, 1969

[21] Appl. No.: 871,392

Related U.S. Application Data

[63] Continuation of Ser. No. 525,484, Feb. 7, 1066, abandoned, which is a continuation of Ser. No. 217,858, Aug. 20, 1962.

[52] U.S. Cl.................. 340/173 CC; 350/160 R
[51] Int. Cl.² ............................................. G11C 13/04
[58] Field of Search.................. 350/160 R, 160 P; 340/173 R, 173 CC, 173 LT; 331/94.5

[56] References Cited
UNITED STATES PATENTS
2,418,780   4/1947   Leverenz .................. 340/173 CC

*Primary Examiner*—Stuart N. Hecker

[57] ABSTRACT

An optical information storage and retrieved system is presented wherein intersecting beams of coherent light at least one of which is information bearing are used to change the state of color centers in a crystal to effect information storage. Information is retrieved or read out by determining the state of color centers in the crystal.

20 Claims, 5 Drawing Figures

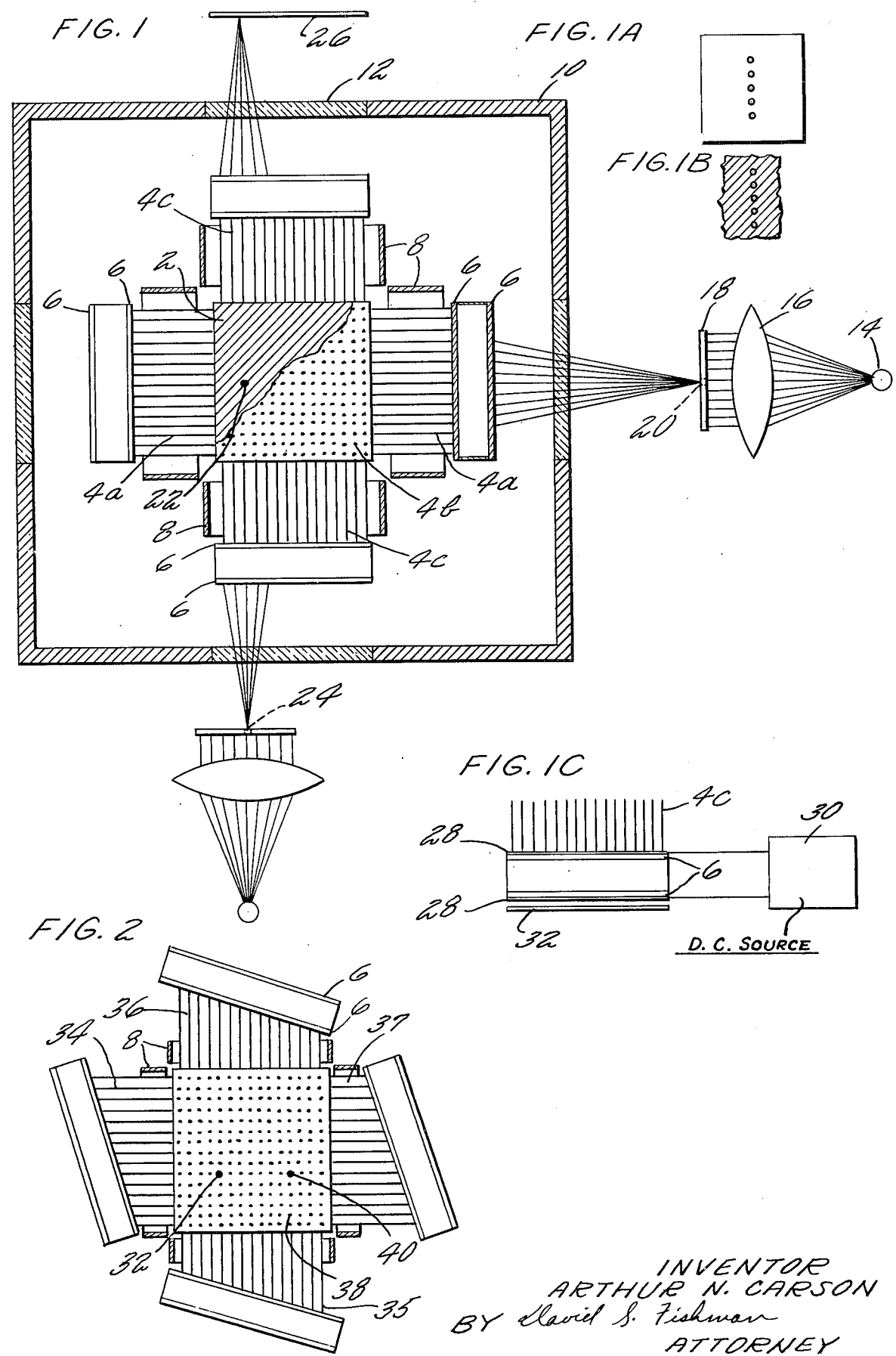

OPTICAL INFORMATION PROCESSING SYSTEM WITH COLOR CENTER CRYSTAL

This is a continuation application of U.S. Pat. application Ser. No. 525,484, now abandoned filed Feb. 7, 1966, for improvements in "Optical Information Processing System with Color Center Crystal", which application Ser. No. 525,484 was a continuation application of U.S. Pat. application Ser. No. 217,858, now abandoned filed Aug. 20, 1962 for improvements in "Optical Information Processing System", by Arthur N. Carson.

This invention relates to an optical information processing system. More particularly, this invention relates to an optical information storage and retrieval system which utilizes the phenomenon of color centers in ionic crystals such as alkali halides.

The phenomenon of color centers, also known as F centers, has been a subject of scientific investigation for many years. An F center constitutes a local imperfection in a crystal such as where an electron is trapped at the position of a missing (negative) halogen ion. Although the trapped electron provides a superficial replacement for the missing halogen ion to provide electrical neutrality, the electron behaves essentially different from the ion. Since the trapped electron is bound by considerably weaker forces than electrons in the atoms it will absorb light of comparatively low energy which cannot be absorbed by electrons bound normally. When the F center electron does absorb a light photon, it is excited to an energy level between the ground state of the F center and the conduction band of the crystal. A further absorption of a proper amount of energy when the F center electron is in the excited state results in the electron being raised to the conduction band of the crystal and being transferred to a neighboring F center which then becomes an F' center containing two electrons. This transfer of the electron in the F center is referred to as a bleaching process because the F center from which the trapped electron has been liberated is no longer capable of absorbing light of the frequency required to raise the F center electron from the ground state to the excited state.

Most alkali halide crystals at room temperature will be rapidly and uniformly bleached when illuminated with a strong beam of light of the proper wave length to raise the F center electrons to the excited state. This bleaching occurs because the excited state to which each F center electron is raised in absorbing a light photon is sufficiently near the conduction band to permit the electron to be liberated into the conduction band by absorbing a small amount of additional energy from thermal lattice vibrations. In some crystals of refractory materials the energy separation between the conduction band and the excited state of the F center electrons is sufficiently large that a thermal transition of this type becomes unlikely, and such crystals will be stable at room temperature. However, most crystals must be cooled to approximately liquid air temperature to prevent unwanted bleaching from occuring.

The present invention employs the difference between the normal colored condition, with the electron situated in the ground state of the F center, and the bleached condition, with the electron trapped in the F' color center, as a memory device for the storage and retrieval of information. Storage of information within the crystal consists of bleaching a small volume element of the crystal, or could also consist of restoring the original color to an already bleached volume element. The present invention employs a dual absorption process of two light photons by each F center trapped electron to accomplish information storage in the crystal. The dual process consists of the use of two different colors of light. One color, referred to as excitation light or F light, is used to raise the F center electron to the excited state. The second color referred to as ionization light and which may be defined as the energy absorbed by the electron while in the excited state, is used to elevate the electron from the excited state into the conduction band of the material for transfer to and trapping by a neighboring occupied F center. A significant advantage of this dual optical process for bleaching resides in the use of two intersecting regions of illumination to define the element of volume which is to be bleached. The crystal will be bleached only in that volume where both colors of light are jointly effective, thus permitting precise location and resolution of bleached regions by focusing two orthogonal differently colored light beams upon the same volume of the material.

The present invention also accomplishes readout or retrieval of stored information by means of a second dual process similar to the dual process used for bleaching. The primary light beam in either readout or bleaching serves to elevate color center electrons from the ground state to the excited state, from which the electron is able to interact with light in the second beam so as to make a second change or transition. This transition or change in the readout process is simply a passage back to the ground state of the F center accompanied by the emission of fluorescent radiation; and the secondary beam referred to as readout light or fluorescent light, which causes the return to the ground state to occur, must have the same color as the spontaneous fluorescence which would naturally occur if the F center excited electron were allowed to naturally decay back to the ground state. The illumination of the excited F center with light of the same color as would occur through spontaneous fluorescence results in an induced fluorescence, and hence the intensity of the secondary light beam is amplified during its passage through the selected elementary volume thus indicating that the electron in that particular elementary volume have not been transferred to F' traps and that the region has not been bleached. The indication obtained from an elementary volume which has been bleached and does contain a stored bit of information is simply no amplification of the incident secondary beam. Of course, it will be understood that the opposite process could equally as well be used for storage and retrieval. That is, information could be stored by leaving an F center in the colored or unbleached condition and bleaching the surrounding area, the unbleached F center representing a bit of stored information. In this case, amplification would indicate that information was stored in the elementary volume, and no amplification would indicate that information was not stored in the volume.

Erasing of stored information is achieved in the present invention by illuminating F' centers with light of the proper energy to ionize the electrons trapped in the F' centers, i.e., to free the trapped electrons in the F' centers. Once ionized and placed in the conduction band of the material, the electrons will be readily trapped by the original F centers which have been depopulated of electrons during bleaching. This ionization of F' centers is a one step process, there being no known bound excited state of the F' center, and hence erasing will be done in large blocks of memory simultaneously.

A further aspect of the present invention involves the storing of patterns of information in the crystal rather than merely storing single bits of information. Since the bleaching of any one elementary volume and the attendant storage of information in that volume depends upon the interaction and joint influence of the primary and secondary light beams, a pattern of information, such as a series of digital ones and zeros, numbers, words, geometric figures, etc., can be stored in the crystal at one time by having one light beam bear the desired pattern or by having both light beams bear parts of the pattern to be stored.

Accordingly, one feature of the present invention is a novel optical memory device for storage and retrieval of information.

Another feature of the present invention is a novel optical memory device utilizing the phenomenon of color centers in crystals for storage and retrieval of information.

Still another feature of the present invention is a novel optical memory device which accomplishes information storage in a crystal by bleaching color centers.

Still another feature of the present invention is a novel optical memory device in which information is stored by bleaching color centers and in which readout is accomplished by inducing characteristic fluorescence from color centers.

Still another feature of the present invention is a novel optical information storage and retrieval device in which entire patterns of information can be stored or read out in one operation.

Other features and advantages will be apparent from the specification and claims and from the accompanying drawings which illustrate an embodiment of the invention.

FIG. 1 is a schematic representation of the memory storage device of the present invention.

FIG. 1a is a view of a pattern of bits of information which may be simultaneously stored in the device of FIG. 1.

FIG. 1b is a view of the pattern stored in the memory device when using the pattern of FIG. 1a.

FIG. 1c is an illustration of a modified focusing system which may be used with the device of FIG. 1.

FIG. 2 is an illustration of a modification of the memory storage device of this invention by which shifting of information can be accomplished.

Referring now to FIG. 1, the memory storage device has a KCl crystal 2 having color centers therein. Attached to and extending from each side of the crystal are bundles 4a, 4b and 4c of closely packed optical wave guide fiber lasers. The lasers are shown representatively in the drawing, but in reality they are extremely small diameter optical wave guide fibers of a type known in the art. The lasers are packed in bundles which cover substantially the entire area of each side of the crystal and which contain millions of individual strands, each of the strands having a rod encased in a tube having a lower index of refraction than the rod. Several different types of lasers will be required to produce different spectral outputs so that excitation light, ionization light, fluorescent light or erasing light can be obtained. It may be desirable, although at the sacrifice of some resolution, to mix lasers of different types, i.e., different spectral outputs, in each bundle in order to gain symmetry of operation. In this way the cube of material 2 would be symmetric with respect to the performance of all operations. However, resolution would be improved if only one type of laser were attached to each side of the crystal, and the following discussion will be based in this arrangement so that excitation light will be emitted only from certain sides of the crystal, ionization light from other sides, etc. More particularly, excitation light will be supplied by lasers 4a, ionization light will be supplied by lasers 4b which are present on the front and back sides of the crystal and extend outwardly from the crystal perpendicular to the plane of the paper, and readout light will be supplied by lasers 4c.

The absorption characteristics of the crystal used for memory storage determine the wave lengths of light necessary to accomplish the various operations. That is, a crystal will have a characteristic band of wave lengths for each operation. The absorption characteristics for the KCl crystal for excitation light are determined by the F center absorption line which achieves maximum absorption at a wave length of 0.563 microns and has a width of approximately ± 10%; and excitation light can be provided with lasers of cadmium fluoride with europtium impurities ($CdF_2$:Eu) which emit light of a wavelength of 0.589 microns. The fluorescent emission characteristics of KCl are determined by the F center emission line which achieves maximum emission at a wave length of 1.01 microns and has a width of approximately ± 10%; and fluorescent light can be provided with lasers of calcium tungstate with neodymium impurities ($CaWo_4$:$N_2$) which emit light of a wave length of 1.06 microns. The absorption characteristics of KCl for ionization light are determined by the F center excited absorption line which achieves maximum absorption at a wave length of 2.4 microns and has a width of approximately ± 10%; and ionization light can be provided with lasers of calcium fluoride with uranium impurities ($CaF_2$:U) which emit light of a wave length of 2.5 microns. The absorption characteristics of KCl for erasing light are determined by the F' center absorption line which achieves maximum absorption at a wave length of 0.75 microns and has a width in excess of ± 10%; and erasing light can be provided with lasers of calcium fluoride with samarium impurities ($CaF_2$:Sm) which emits light of a wave length of 0.708 microns.

Attached to each bundle of lasers is a pair of highly reflecting, high parallel Fabry-Perot plates 6 with a material therebetween having a large Kerr coefficient, such as liquid nitrobenzine. The plates 6 serve to establish an interference pattern of alternately bright and dark rings on the one of the plates which is attached to a laser bundle when the other of the plates is illuminated from the point source of light located exteriorly of crystal 2. The material between the plates 6, due to its large Kerr coefficient can be used to change the radii of the interference patterns. The establishment of the interference pattern on the plate attached to the laser bundle will initiate firing of lasers opposite the bright rings. The light emitted by the individual lasers is all mutually coherent due to the property of lasers that the light which they emit is coherent with the triggering stimulus and due to the fact that all the triggering stimuli are coherent with each other because they are parts of the same interference pattern. Thus, the light emitted from the lasers will be focused at a point within crystal 2 defined by the characteristics of the interference pattern. Each bundle of lasers is surrounded by an arc discharge tube 8 which provides energy for pumping the lasers to the threshold level so that the lasers can be fired or triggered by the bright rings of the interference pattern.

In the event that it is necessary to cool crystal 2 to prevent thermal transition of excited electrons from the color centers to the conduction band of the crystal, an insulated container 10 can be provided as shown in FIG. 1. Container 10 would house a bath of suitable refrigerant such as liquid air to cool crystal 2, and would have transparent windows 12 in alignment with each side of crystal 2 to allow the passage of light to and from the crystal.

To store information in crystal 2, a source of monochromatic light is placed at the focal point of a lens 16. Lens 16 delivers the light from source 14 to a mask 18 such as a photographic negative which has been previously exposed to allow passage of light only through a small area which is effectively a point source of light 20. The light from point source 20 travels to the plates 6 where an interference pattern of alternately bright and dark rings is established, each ring being of uniform intensity around its circumference since source 20 is a single point source. Those of the lasers of bundle 4a which are aligned with the bright rings of the interference pattern will be triggered and will produce beams of light which will intersect constructively at the focal point 22 which is defined by the characteristics of the interference pattern. Lasers 4a are selected so that the light emitted therefrom is of the proper wave length and intensity to excite the color centers at point 22 to raise the electrons therein to the excited state.

In a manner similar to the establishment of point source 20, a point source of light is established along a line through point 22 and perpendicular to the plane of the paper. This point source establishes an interference pattern which triggers certain of lasers 4b to produce coherent beams of light which penetrate crystal 2 and focus at point 22. Lasers 4b are selected so that the light emitted therefrom is of the proper wave length and intensity to raise the excited electrons of the color centers to the conduction band of the crystal thereby bleaching the color centers and storing a bit of information in the crystal. For example, the position of point 22 may itself represent a bit of information. It will be observed that the sides of the crystal from which the intersecting beams of light emanate, and the beams themselves, need not be mutually perpendicular, but only at an angle to each other.

Information readout or retrieval is accomplished in the following manner. Point source 20 is re-established so that excitation light is again focused on point 22 by lasers 4a. Another point source is established at point 24 along a line extending from point 22 perpendicular to the bottom surface of cube 2. In the manner similar to that described for lasers 4a and 4b, point source 24 establishes an interference pattern which triggers lasers 4c and produces coherent beams of light which focus at point 22. Lasers 4c are selected to provide the proper wave length and intensity to generate fluorescent light when focused on a color center in the excited state. Thus, in the readout process, point 22 is illuminated with exciting and fluorescent light from mutually perpendicular directions. However, since the color centers at point 22 are in the bleached condition there are no electrons present which the flourescent light from lasers 4c could drive back to the ground state. Consequently, the flourescent light from the lasers 4c at the bottom of cube 2 passes on through the cube and impinges on the ends of lasers 4c attached to the top of crystal 2 in the form of an interference pattern generated by a point source of light at point 22 between the top and bottom surfaces of cube 2 which act as interferometer plates. Some of the lasers 4c at the top of crystal 2 are fired by this impingement of light and an interference pattern is established which focuses as a point image screen 26 which is a recording device sensitive to the wave length of the fluorescent light such as film or a photocathode. The light striking screen 26 is unamplified over the light which was emitted from lasers 4c at the bottom of cube 2, and this state of unamplification constitutes an indication that a bit of information is stored at point 22.

An alternate method of readout would involve increasing the depth of the light passing portion 20 of mask 18 in the plane of the paper and widening source 24. This would result in illuminating a band of color centers through point 22 and parallel to the top and bottom of the cube with exciting light while at the same time illuminating this band with fluorescent light. The color centers on either side of point 22 would thus be raised to the excited state, and the fluorescent light focused on these excited color centers would be amplified in passing to screen 26. Thus, the reading on screen 26 will show an unamplified spot flanked by amplified spots for readout.

Of course, it will be borne in mind that information could have been stored at point 22 by bleaching color centers around point 22 while leaving point 22 in the ground state. In this event, the readout process would result in an amplified signal at screen 26 representing the storage of information at point 22.

The preceding discussion has described the storage and retrieval of information at the rate of one bit of information per cycle, but it is desirable to store and retrieve information in a parallel process involving several bits of information in each cycle. This objective can be accomplished by feeding patterns of information into crystal 2. As shown in FIG. 1a, mask 18 has been exposed so as to constitute, when illuminated by source 14, a vertical series of closely adjacent point sources of light. The light from these point sources will impinge upon the interference plates to produce an interference pattern in which the individual rings vary in intensity around their circumference. As a result, lasers 4a would be triggered to reproduce the pattern in the crystal as a vertical series of closely adjacent volume elements containing excited color centers as shown in FIG. 1b. The mask used to supply light to lasers 4b would then be provided with a vertically extending opening of discrete depth so that the lasers 4b would be fired to produce a beam of ionization light to bleach the vertical band of color centers and store a pattern of information in the crystal. It will also be understood that since bleaching occurs only where both the primary exciting beam of light and the secondary ionization beam of light intersect, a desired pattern can be carried either entirely on one beam or partially on both beams. Simultaneous readout of several bits of information can also be accomplished as, for example, by illuminating a band of color centers along a line perpendicular to the plane of the paper with excitation light and extending source 24 perpendicular to the plane of the paper.

A further modification of the device of FIG. 1 is shown in FIG. 1c. The preceding discussion regarding storage and retrieval has proceeded on the assumption that the point sources supplying the light in orthogonal directions to establish the interference patterns are positioned manually or by any convenient method. However, it may be desirable to position these sources of light automatically and swiftly according to a predetermined program to increase the speed of operation of the device. The position of any one point source of light can be used as a reference, and the desired position of any other cooperating point source of light is automatically determined. Three directions of movement can occur to change the position of one light source, and movements in two of the directions in the plane of photographic negative 18 can be accomplished by selectively positioning the light passing portion 20 at any desired point on the negative. The structure shown in FIG. 1c is designed to eliminate the necessity for moving the point sources of light toward and away from their respective sides of the crystal. To this end, each of the interference plates 6 has an overlay of a grid 28 of conducting wires and a potential difference is maintained across plates 6 by a variable source of DC potential 30 connected to grids 28. A polaroid filter 32 is placed in front of the plate 6 on which the point source of light impinges, and the electrostatic field across plates 6 can be adjusted to vary the index of refraction encountered by the polarized light passing through the medium between the interference plates. Thus, the radii of the rings of the interference pattern can be adjusted to regulate the point of focus of the laser light inside crystal 2.

Referring now to the structure shown in FIG. 2, a device is shown whereby a bit of stored information can be transferred or shifted from one place in the memory to another place. A bit of information represented by a bleached volume at point 32 can be illuminated, along with the surrounding volume, with exciting light from lasers 34 and with fluorescent light from lasers 35, both of which are triggered by interference patterns as previously described. The combined action of this focusing of exciting and fluorescent light on point 32 will be to generate an amplified emission of the outline or complement of the information stored at point 32 traveling in the direction of the light emitted from lasers 35. Each laser bundle in FIG. 2 extends from the crystal at gradually and uniformly increasing lengths so that the ends attached to the plates 6 terminate in a plane at an acute angle to the surface of the crystal, and the plates 6 are similarly disposed. The time required for light to traverse a laser is a direct function of the length of the laser, and thus the direction of travel of the wave front of the light emitted from lasers 35 is at an acute angle to the side of the crystal to which those lasers are attached. The fluorescing complement of the information stored at point 32 will impinge on the top of the crystal along this direction of travel, and the light incident on the top of the crystal appears to be emanating from a point source located at point 32. The surfaces of the crystal are made to be highly reflective so that opposing sides of the crystal form interference plates. Thus, an interference pattern will be established at the top surface of the crystal to trigger lasers 36 which also emit fluorescing light in accordance with the complement of the information stored at point 32. However, because the light incident on the top surface of the crystal from point 32 was traveling at an angle to the top surface of the crystal, the light emitted from the variable length lasers 36 will be turned and will travel in a direction perpendicular to the top surface and will be temporarily refocused slightly to the right of point 32. This new focusing to the right of the point 32 now acts as a point light source for lasers 35 in the above-described reflection process continues with the result that the complement of the information stored at point 32 is effectively caused to move in a path directly to the right of point 32. The new point to which it is desired to ultimately shift point 32 can be determined by triggering lasers 38 and either lasers 34 or 37 to focus ionization light and exciting light, respectively, at the new point, point 40, at the time that the complement of the information stored at point 32 reaches point 40. The interaction of the complement of the information stored and point 32 with the exciting and ionization light will result in the bleaching at point 40 to store at point 40 the information contained at point 32.

An alternate method of information transfer or shifting would be to focus ionization light at point 32 from lasers 35 which would be chosen to emit ionization light rather than fluorescent light as in the foregoing explanation. This ionization light would be focused and refocused to the right of point 32 as explained above, and point 40 could be illuminated with exciting light from appropriately selected lasers 38 to bleach point 40 and store the information from point 32 at point 40.

By way of further discussion, as more fully disclosed and claimed in my application Ser. No. 453,294, filed May 5, 1965, now U.S. Pat. No. 3,568,167, it should be pointed out that bleaching can be made to occur by focusing exciting light on a crystal which is raised to a sufficiently high temperature or by focusing exciting light at low temperature in the presence of an electric field. However, assuming that two intersecting beams of light are used to accomplish bleaching, the dimensions of the region of intersection of the two beams of light will be determined by the dimensions of the sources of the two beams. Assuming that maximum resolution of about one wave length of light is provided by the focusing devices, an ultimate storage capacity of about $1/\lambda^3$ where $\lambda$ is the wavelength of the light or about $10^{12}$ bits/cm$^3$ may be attainable with this technique.

It is to be understood that the invention is not limited to the specific embodiment herein illustrated and described but may be used in other ways without departure from its spirit as defined by the following claims.

I claim:

1. Apparatus comprising a body having color centers therein normally in a first stable state, means to generate first and second coherent light beams of predetermined wave lengths, at least one of said beams containing information, means for directing said first and second beams to intersect at a selected part of said body to illuminate color centers in said selected part with both of said coherent light beams, said illuminated color centers being changed to a second stable state whereby information is stored in said body where said beams intersect, and means for irradiating said body with at least one coherent light beam to retrieve said information.

2. Apparatus as in claim 1 and including means for generating interference patterns, and means for modulating said interference patterns to modulate said information upon said one beam.

3. A three-dimensional optical information processing system including a crystal having color centers therein normally in a stable ground state, first laser means associated with a first surface of said crystal, second laser means associated with a second surface of said crystal, said second surface being at an angle to said first surface, means for actuating said first laser means, means for focusing the output of said first laser means on an internal portion of said crystal including a color center to establish a color center excited state, means for actuating said second laser means and introducing the output of said second laser means into said crystal along a path intersecting the output of the first laser at said internal portion of said crystal to change the color center from an excited state to a stable state other than the ground state, and means for illuminating said crystal with the output from at least one laser to determine the state of color center.

4. An optical information processing system including a crystal having color centers therein normally in a ground state, a plurality of first monochromatic optical fiber lasers attached to a first surface of said crystal, a plurality of second monochromatic optical fiber lasers attached to a second surface of the crystal, said first and second surfaces of the crystal being at an angle to each other, means including a first pair of parallel reflecting surfaces attached to the first lasers and a second pair of parallel reflecting surfaces attached to the second lasers for producing interference patterns in response to patterns of light incident thereon to fire selected ones of said first and second lasers and focus the light therefrom on a volume within said crystal, at least one of the patterns of incident light being information bearing, the light emitted from said selected ones of said first plurality of lasers being of selected wave length in accordance with absorption characteristics of said crystal to raise color centers in said volume to an excited state in accordance with the pattern of light incident on said first pair of parallel reflecting surfaces, and the light emitted from said second plurality of lasers being of selected wave length in accordance with absorption characteristics of said crystal to alter the excited state color centers to a stable state and means for determining the state of the color centers in said volume.

5. An optical information processing system as in claim 4 wherein opposing sides of said crystal form pairs of parallel reflecting surfaces, the optical fiber lasers extending from each pair of opposing sides for uniformly varying distances outwardly therefrom along the sides.

6. An optical information processing system including a crystal having color centers therein normally in a ground state, a plurality of first monochromatic optical fiber lasers attached to a first surface of said crystal, a plurality of second monochromatic optical fiber lasers attached to a second surface of the crystal, said first and second surfaces of the crystal being at an angle to each other, means including a first pair of parallel reflecting surfaces attached to the first lasers and a second pair of parallel reflecting surfaces attached to the second lasers for producing interference patterns in response to patterns of light incident thereon to fire selected ones of said first and second lasers and focus the light therefrom on a volume within said crystal, the light emitted from said selected ones of said plurality of lasers being of selected wave length in accordance with absorption characteristics of said crystal to raise color centers in said volume to an excited state in accordance with the pattern of light incident on said first pair of parallel reflecting surfaces, and the light emitted from said second plurality of lasers being of selected wave length in accordance with absorption characteristics of said crystal to return the excited state color center from the excited state to the ground state accompanied by an amplified beam of light of the second wave length.

7. An optical information processing system including a crystal having color centers therein normally in a ground state, a plurality of first monochromatic optical fiber lasers attached to a first surface of said crystal, a plurality of second monochromatic optical fiber lasers attached to a second surface of the crystal, said first and second surfaces of the crystal being at an angle to each other, means including a first pair of parallel reflecting surfaces attached to the first lasers and a second pair of parallel reflecting surfaces attached to the second lasers for producing interference patterns in response to patterns of light incident thereon to fire selected ones of said first and second lasers and focus the light therefrom on a volume within said crystal, at least one of the patterns of incident light being information bearing, the light emitted from said selected ones of said first plurality of lasers being of selected wave length in accordance with absorption characteristics of said crystal to raise color centers in said volume to an excited state in accordance with the pattern of light incident on said first pair of parallel reflecting surfaces, and the light emitted from said second plurality of lasers being of selected wave length in accordance with absorption characteristics of said crystal to raise the electron of the color center from the excited state to the conduction band of the crystal to bleach the color centers and store the information carried by the information bearing incident light pattern in said volume; and means for determining the state of color centers in said volume.

8. An optical information processing system as in claim 7 including means for shifting bleached color centers to move the stored information from said volume to another volume in said crystal.

9. An optical information processing system as in claim 8 wherein the means for shifting bleached color centers to move the stored information includes pluralities of optical lasers extending outwardly from pairs of opposing sides of the crystal the length of said optical lasers varying uniformly along said sides of said crystal.

10. The method of storing information in and retrieving information from a crystal having color centers therein normally in a ground state, including the steps of focusing a first light of selected wave length on a volume in said crystal to raise at least one color center therein to an excited state, illuminating said volume with a second light, at least one of said first and second lights being information bearing, said second light being of selected wave length to bleach said color center and store the information borne on said one light, and illuminating said volume with at least one light to determine the state of said color center and retrieve said information.

11. The method as in claim 10 including the steps of illuminating said volume with said first light, and illuminating said volume with a third light of selected wave length to read out the information stored in said volume.

12. A three-dimensional information storage system comprising an element having a plurality of color centers therein, means for switching selected ones of said color centers within the volume of said element from one stable color center state to another stable color center state to thereby store information in said element, and means for determining the state of said selected color centers to retrieve said information without altering the state of the color center.

13. An information storage system as in claim 12 in which said switching means comprises means for generating first and second light beams of selected wave lengths and includes means for illuminating said selected color centers with intersecting beams of said first and second light beams.

14. An information storage system as in claim 13 and including means for selectively varying the areas of intersection of said first and second light beams to thereby vary the information stored in said element.

15. An information storage system as in claim 13 in which said means for determining the state of said selected color centers comprises means for generating a third light beam of selected wave length, and means for converging said first and third light beams upon said selected color centers.

16. An information storage system as in claim 12 in which said element is a crystal, and including means for cooling said crystal to retain said color center stable states.

17. An information storage system as in claim 16 in which said crystal is an alkali halide.

18. A three-dimensional optical information processing system including an element having color centers therein in a first stable state, means for generating a first light of predetermined wave length and intensity, means for focusing said first light on an internal portion of said element to establish color center excited state, means for generating a second light of predetermined wave length and intensity, means for introducing said second light into said element along a path intersecting the first light at the place of focus of said first light to change the color center from an excited state to a second stable state, and means for illuminating said element with at least one light to determine the state of the color center.

19. A three-dimensional optical information processing system including a crystal having color centers therein normally in a stable ground state, means for generating a first light of predetermined wave length and intensity, means for focusing said first light on an internal portion of said crystal to establish a color center excited state, means for generating a second light of predetermined wave length and intensity, means for introducing said second light into said crystal along a path intersecting with the first light at the place of focus of said first light to raise the excited electron of the color center to the conduction band of the crystal and change the color center to a stable state other than the ground state and means for determining the state of the color center without altering the state of the color center.

20. An optical information processing system as in claim 19 in which the means for determining the state of the color center without altering the state of the color center comprises:
said means for focusing said first light on the said internal portion of the crystal;
means for generating a third light of predetermined wave length and intensity; and
means for introducing said third light into said crystal along a path intersecting said first light at the place of focus of said first light.

* * * * *

UNITED STATES PATENT OFFICE
CERTIFICATE OF CORRECTION

PATENT NO. : 3,940,748
DATED : February 24, 1976
INVENTOR(S) : Arthur N. Carson

It is certified that error appears in the above-identified patent and that said Letters Patent are hereby corrected as shown below:

Column 2, line 46, change "electron" to --electrons--

Column 4, line 9, change "in" to --on--

Column 4, line 52, change "high" to --highly--

Column 9, line 19, (Claim 3, line 18) after "of" insert --the--

Column 9, line 67, (Claim 6, line 15) after "said" (second occurrence) insert --first--

Signed and Sealed this twenty-ninth Day of June 1976

[SEAL]

Attest:

RUTH C. MASON
Attesting Officer

C. MARSHALL DANN
Commissioner of Patents and Trademarks